United States Patent
Gorin

(10) Patent No.: US 10,359,459 B1
(45) Date of Patent: Jul. 23, 2019

(54) QUASI-PEAK DETECTION SYSTEMS AND METHODS

(71) Applicant: Keysight Technologies, Inc., Santa Rosa, CA (US)

(72) Inventor: Joseph Michael Gorin, Santa Rosa, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 3 days.

(21) Appl. No.: 15/648,894

(22) Filed: Jul. 13, 2017

(51) Int. Cl.
*G01R 29/08* (2006.01)

(52) U.S. Cl.
CPC ..... *G01R 29/0892* (2013.01); *G01R 29/0814* (2013.01)

(58) Field of Classification Search
CPC .................................................. G01R 29/0892
See application file for complete search history.

(56) References Cited

U.S. PATENT DOCUMENTS 6,144,341 A * 11/2000 Kraz .................... G01R 31/001
343/703

OTHER PUBLICATIONS

Keysight Technologies, Spectrum and Signal Analyzer Measurements and Noise, Aug. 2, 2014.
Keysight Technologies, Using Noise Floor Extension in the PXA Signal Analyzer, Jul. 31, 2014.
Siegfried Linkwitz, Realization of CISPR Quasi-Peak Detection Requirements with an Envelope Quasi-Peak Detector, Oct. 16-18, 1984.
"Quasi-peak detector", Wikipedia, Jan. 30, 2015, 2 pgs.

* cited by examiner

*Primary Examiner* — Clayton E. LaBalle
*Assistant Examiner* — Jas A Sanghera

(57) ABSTRACT

Generally, in accordance with the various illustrative embodiments of the invention, a signal analyzer can incorporate a quasi-peak detection circuit that includes a detector diode. The detector diode is reverse-biased by using a direct-current (DC) voltage source. In some exemplary implementations, the DC bias voltage is defined on the basis of a predicted DC voltage at an output node of the quasi-peak detection circuit in response to a noise level contribution of the signal analyzer when the detector diode is unbiased. A signal is propagated through the quasi-peak detection circuit after the detector diode is reverse-biased, followed by a noise floor adjustment procedure. The noise floor adjustment procedure includes an adjustment directed at least in part, at compensating for the DC bias voltage that is used to reverse-bias the detector diode.

20 Claims, 8 Drawing Sheets

US 10,359,459 B1

QUASI-PEAK DETECTION SYSTEMS AND METHODS

BACKGROUND

Noise that is intrinsic to a signal analyzer may adversely impact the dynamic range of the signal analyzer if this intrinsic noise is not taken into consideration when carrying out signal measurements. The intrinsic noise, which limits the lowest signal level detectable by the signal analyzer, can be characterized by what is known in the art as a noise floor. The noise floor can be measured by observing a spectral output on a display of the signal analyzer after terminating one or more ports of the signal analyzer with a characteristic impedance, such as 50 ohms.

A user of the signal analyzer may find it difficult to accurately determine the signal level when the amplitude of a signal is in the vicinity of the noise floor of the signal analyzer. Traditional solutions that have been used to address this issue involve estimating an amplitude of the signal and compensating for the noise contribution of the signal analyzer. However, in at least some cases, the estimation can be erroneous and may lead to overcompensation being applied. Overcompensation makes a noise contribution of the signal analyzer appear even lower than what would be the ideal case with no noise contribution at all. Consequently, such conventional solutions can be misleading and erroneous.

SUMMARY

According to one exemplary embodiment of the present invention, a method includes reverse-biasing a detector diode of a quasi-peak detection circuit in a signal analyzer; and executing a noise floor adjustment procedure upon a signal propagated through the quasi-peak detection circuit, the noise floor adjustment procedure directed at least in part, at compensating for a direct-current (DC) bias voltage used for reverse-biasing the detector diode.

According to another exemplary embodiment of the present invention, a method includes providing a quasi-peak detection circuit in a signal analyzer, the quasi-peak detection circuit comprising a detector diode; determining a predicted DC voltage at an output of the quasi-peak detection circuit in response to a noise level contribution of the signal analyzer when the detector diode is unbiased; using the predicted DC voltage to define a DC bias voltage; and using the DC bias voltage to reverse-bias the detector diode.

According to yet another exemplary embodiment of the present invention, a signal analyzer includes a quasi-peak detection circuit, a voltage source, and a noise floor adjustment system. The quasi-peak detection circuit includes a detector diode and the voltage source provides a direct-current (DC) bias voltage to reverse-bias the diode. The noise floor adjustment system can execute a noise floor adjustment procedure upon a signal received in the signal analyzer and propagated through the quasi-peak detection circuit, the noise floor adjustment procedure directed at least in part, at compensating for the DC bias voltage used to reverse-bias the detector diode.

Other embodiments and aspects of the present invention will become apparent from the following description taken in conjunction with the following drawings.

BRIEF DESCRIPTION OF THE FIGURES

Many aspects of the invention can be better understood by referring to the following description in conjunction with the accompanying claims and figures. Like numerals indicate like structural elements and features in the various figures. For clarity, not every element may be labeled with numerals in every figure. The drawings are not necessarily drawn to scale; emphasis instead being placed upon illustrating the principles of the invention. The drawings should not be interpreted as limiting the scope of the invention to the example embodiments shown herein.

DETAILED DESCRIPTION

Throughout this description, embodiments and variations are described for the purpose of illustrating uses and implementations of inventive concepts. The illustrative description should be understood as presenting examples of inventive concepts, rather than as limiting the scope of the concepts as disclosed herein. Towards this end, certain words and terms are used herein solely for convenience and such words and terms should be broadly understood as encompassing various objects and actions that are generally understood in various forms and equivalencies by persons of ordinary skill in the art. For example, the label "signal analyzer" as used herein encompasses various instruments that are often referred to by various alternative labels such as "spectrum analyzer" and "electro-magnetic interference (EMI) analyzer." The word "connected" as used herein generally indicates a physical connection between two objects, the word "couple" as used herein generally refers to a transfer of a signal from one element to another, and the word "propagate" as used herein generally refers to the passage of a signal through an element such as a detector diode or resistor. As another example, the phrase "configured to" as used herein generally indicates refers to an object having a physical structure and/or capability to execute an action that is described in the context of the phrase. It should also be understood that the word "example" as used herein is intended to be non-exclusionary and non-limiting in nature. More particularly, the word "exemplary" as used herein indicates one among several examples and it should be understood that no special emphasis, exclusivity, or preference, is associated or implied by the use of this word.

Generally, in accordance with the various illustrative embodiments disclosed herein, a signal analyzer can incorporate a quasi-peak detection circuit that includes a detector diode. The detector diode is reverse biased by using a direct-current (DC) voltage source that provides a DC bias voltage. The DC bias voltage can be defined in various ways, such as on the basis of a predicted DC voltage at an output of the quasi-peak detection circuit in response to a noise level contribution of the signal analyzer without the DC bias voltage being applied to the detector diode. A signal is propagated through the quasi-peak detection circuit after the detector diode is reverse-biased. This operation is followed by a noise floor adjustment procedure that is directed at least in part, at compensating for the DC bias voltage used to reverse-bias the detector diode.

Figure 1:
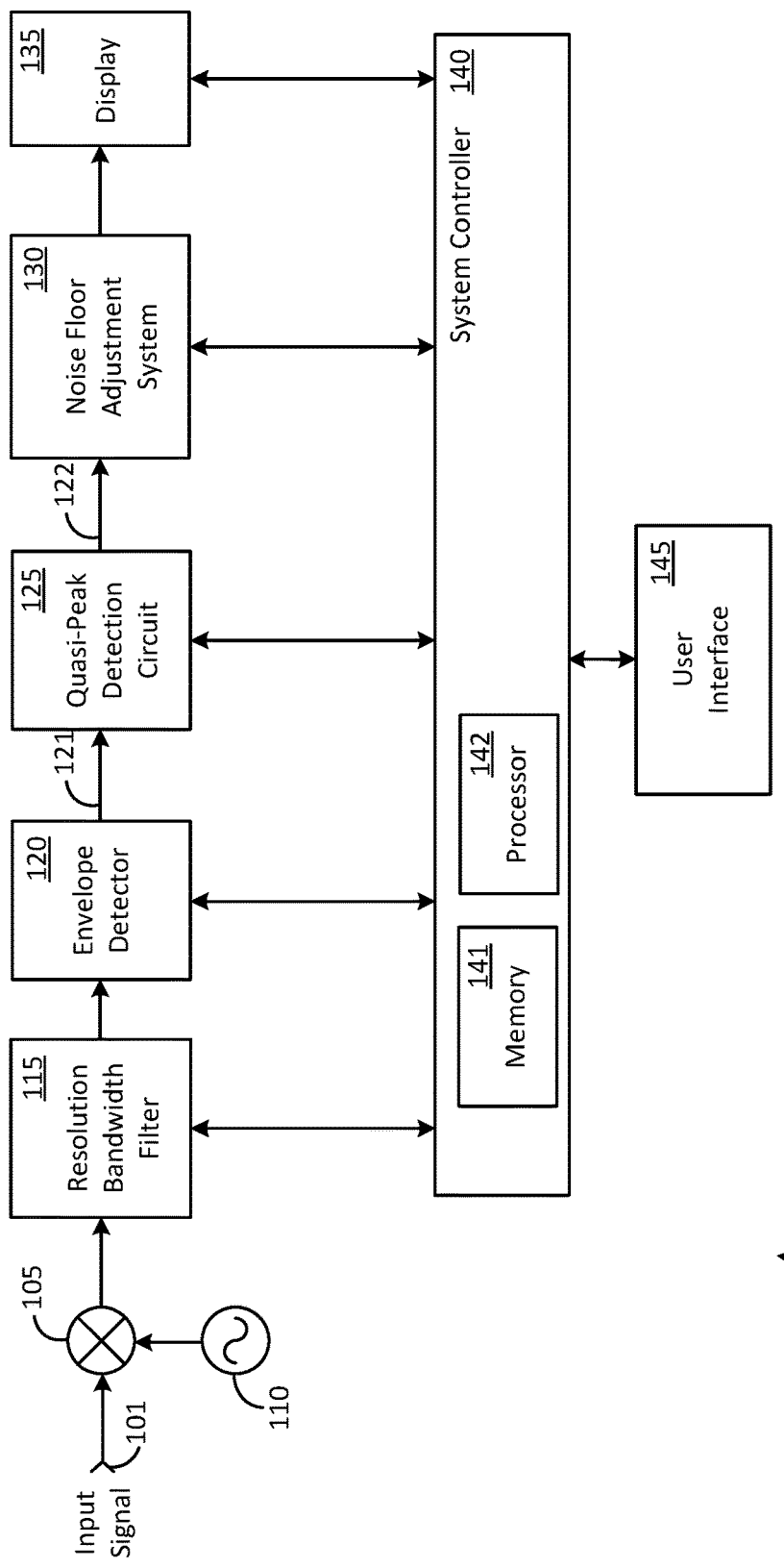
FIG. 1 shows some functional blocks of an exemplary signal analyzer incorporating a quasi-peak detection circuit in accordance with an exemplary embodiment of the present invention.

FIG. 1 shows some functional blocks of an exemplary signal analyzer 100 incorporating a quasi-peak detection circuit 125 in accordance with an exemplary embodiment of the present invention. The signal analyzer 100 can be used to view a spectrum of an input signal such as a radio-frequency (RF) input signal carrying information or an EMI signal causing electromagnetic interference. The input signal, which is coupled into an input port 101 of the signal analyzer 100, is provided to a mixer 105 for frequency down-conversion. The frequency down-conversion is carried out by using a local oscillator 110 as is known in the art. The down-converted signal is propagated through a resolution bandwidth filter 115 and an envelope detector 120 before being coupled into the quasi-peak detection circuit 125 (via a link 121). It must be understood that various other functions can be executed upon the input signal prior to coupling the input signal into the quasi-peak detection circuit 125. These other functions can be executed by using other functional blocks that are not shown in FIG. 1.

The signal that is available at an output node of the quasi-peak detection circuit 125 is coupled (via a link 122) into a noise floor adjustment system 130. The noise floor adjustment system 130 compensates for a DC bias voltage that is used to place a detector diode (not shown) in a reverse-biased condition for mitigating adverse effects introduced by a noise floor contribution of the signal analyzer 100. The noise floor contribution, which is caused by various noise sources in the signal analyzer 100, can be determined for example, by observing a display 135 when the input port 101 is terminated by a characteristic impedance, such as 50 ohms.

Also included in the signal analyzer 100, is a system controller 140 that can be communicatively coupled (via bi-directional communication links, for example) to various elements such as the resolution bandwidth filter 115, the envelope detector 120, the quasi-peak detection circuit 125, the noise floor adjustment system 130, and the display 135. The signal analyzer 100 includes a processor 142 and a memory 141. The memory 141 is used, at least in part, to store computer-executable instructions that are accessed by the processor 142 for executing various actions in accordance with various embodiments of the invention. The signal analyzer 100 further includes a user interface 145 used for executing various user-related operations upon the signal analyzer 100. The user interface 145 can be implemented in various ways, such as by providing hardware control knobs or buttons on a front panel of the signal analyzer 100 and/or by providing a visual control interface (touch screen, soft keys etc.) on the display 135.

A user (not shown) can use the user interface 145 to set various parameters such as a resolution bandwidth of the resolution bandwidth filter 115 and a sweep time of the display 135. The resolution bandwidth determines the smallest resolvable frequency separation of a signal spectrum when displayed on the display 135. Typically, a wider resolution bandwidth results in a larger portion of the signal spectrum being displayed on the display 135 with a lower level of detail. For example, if the resolution bandwidth is set wider than the frequency separation between two signals, the signal spectrum displayed on the display 135 can misleadingly indicate a single signal rather than the two distinct signals. On the other hand, if the resolution bandwidth is set equal to the frequency separation between the two signals, the signal spectrum displayed on the display 135 may include two distinct signals with an ambiguous 3 dB dip between the two signals. The bandwidth-limited radio-frequency signal that is propagated out of the resolution bandwidth filter 115 is coupled into the envelope detector 120, which operates in cooperation with the quasi-peak detection circuit 125 to carry out signal processing upon the bandwidth-limited radio-frequency signal.

The characteristics of the spectrum displayed on the display 135, particularly the noise floor, is determined by a combination of various operating parameters such as the resolution bandwidth set in the resolution bandwidth filter 115 and the DC bias voltage used to reverse-bias the detector diode. In some applications, such as those associated with EMI measurements, the resolution bandwidth filter 115 is set in accordance with one or more EMI standards (a bandwidth of 120 kHz for signals between 30 MHz and 1000 MHz for example). The noise floor adjustment system 130 is used to provide an adjustment that is directed at least in part, at compensating for the DC bias voltage used to reverse-bias the detector diode in the quasi-peak detection circuit 125. In some embodiments, the compensating can be carried out by using a non-linear subtraction procedure. Details pertaining to the DC bias voltage and the noise floor adjustment system 130 will be described below in more detail using other figures.

Figure 2:
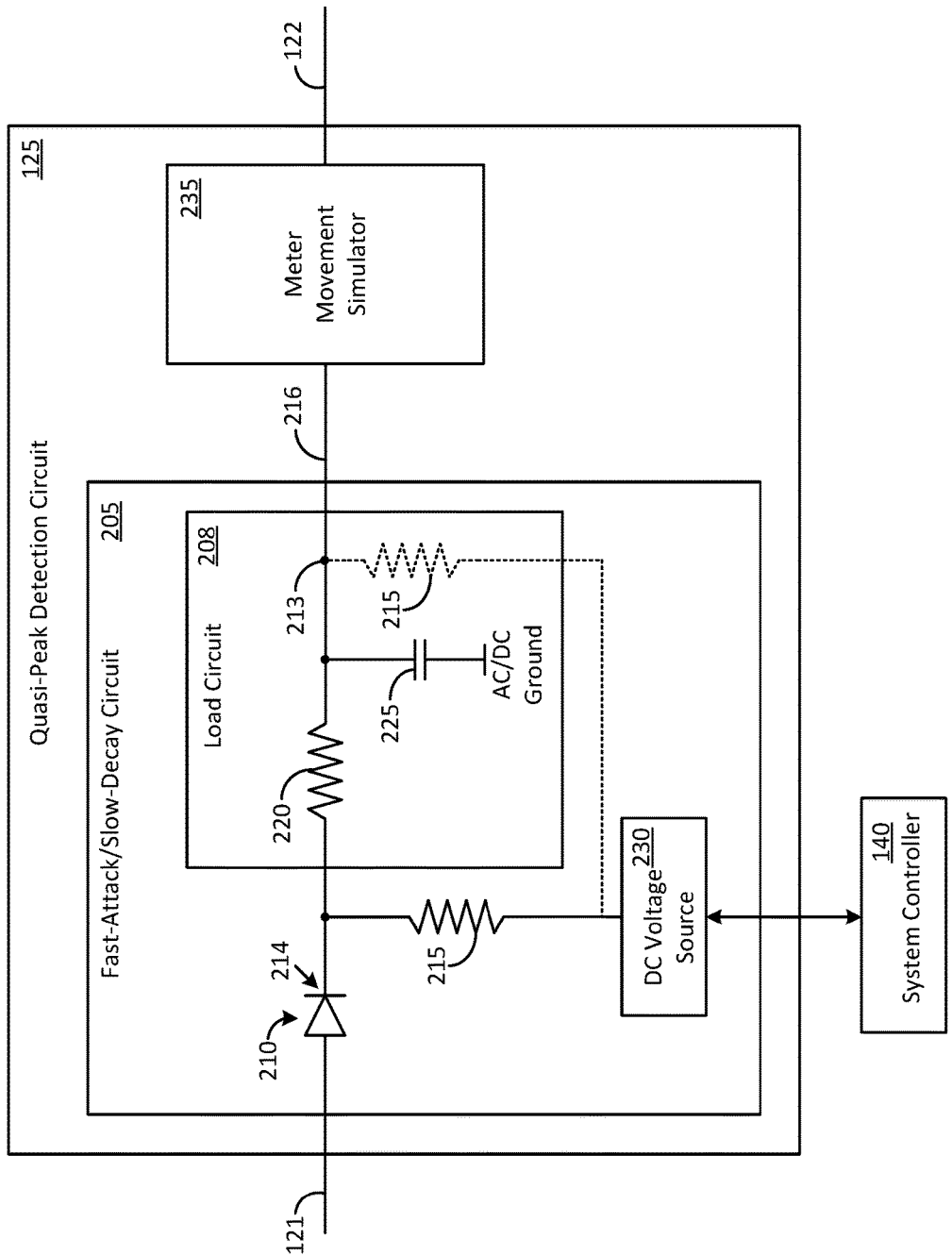
FIG. 2 illustrates an exemplary quasi-peak detection circuit that includes a detector diode that is reverse-biased using a DC voltage source in accordance with an exemplary embodiment of the present invention.

FIG. 2 illustrates an exemplary quasi-peak detection circuit 125 that includes a fast-attack/slow-decay circuit 205 connected to a meter movement simulator 235 (via a link 216) in an exemplary implementation in accordance with the invention. More particularly, the quasi-peak detection circuit 125 shown in FIG. 2 can be interpreted as an equivalent circuit representation. Some parts of this equivalent circuit representation can be implemented in hardware and/or software (the fast-attack/slow-decay circuit 205, for example), while some other parts, such as the meter movement simulator 235, can be viewed as a symbolic representation of the dynamics of an indicating instrument when associated with the quasi-peak detection circuit 125.

The fast-attack/slow-decay circuit 205, which can be implemented in various ways in one or both of an analog domain or a digital domain, includes a detector diode 210 that is reverse-biased by using a DC voltage source 230 in accordance with an exemplary embodiment of the present invention. In this exemplary implementation, the detector diode 210 is reverse-biased by connecting a positive voltage terminal of the DC voltage source 230 to a cathode terminal 214 of the detector diode 210 via a resistor 215. The amplitude of the DC bias voltage provided by the DC voltage source 230 is set by the system controller 140 using a software program executed by the processor 142.

In some other implementations, the detector diode 210 can be reverse-biased by using other configurations such as by eliminating the positive voltage provided at the cathode terminal 214 of the detector diode 210 and instead connecting a negative voltage terminal of the DC voltage source 230 to an anode terminal of the detector diode 210 through another resistor (not shown). Irrespective of the polarity used, the amplitude of the DC bias voltage provided by the DC voltage source 230 can be determined using certain procedures that will be described below in more detail.

The fast-attack/slow-decay circuit 205 also includes a load circuit 208 that is connected to the cathode terminal 214 of the detector diode 210. The load circuit 208 includes a resistor 220 connected to a capacitor 225. The capacitor 225 stores a charge when the signal is propagated through the detector diode 210. The charge is stored in the capacitor 225 at a charging rate defined by a charging time constant provided by the capacitor 225 and the resistor 220. When the detector diode 210 is not propagating the signal, the discharge rate is defined by a discharging time constant provided by the capacitor 225 and a series combination of the resistor 220 and the resistor 215.

The resistance value of the resistor 220 is selected to be low in comparison to the resistance value of the resistor 215 so as to provide a smaller charging time constant in comparison to the discharging time constant, thereby providing the fast-attack/slow-decay characteristic to the fast-attack/slow-decay circuit 205. In one exemplary implementation, the resistor 220 has a value that is 500 times smaller than the resistor 215 (for example, 1K ohms versus 500K ohms) thereby providing a charging time constant that is 500 times faster than a discharging time constant.

It will be pertinent to point out that as a result of the significant difference in resistance values between the resistor 220 and the resistor 215, the resistor 215 can be connected to a junction of the resistor 220 and the capacitor 225 (node 213) rather than being connected to the cathode terminal 214 of the detector diode 210, without adversely affecting the operation of the fast-attack/slow-decay circuit 205. This alternative configuration is shown in a dotted line format in FIG. 2.

Figure 3:
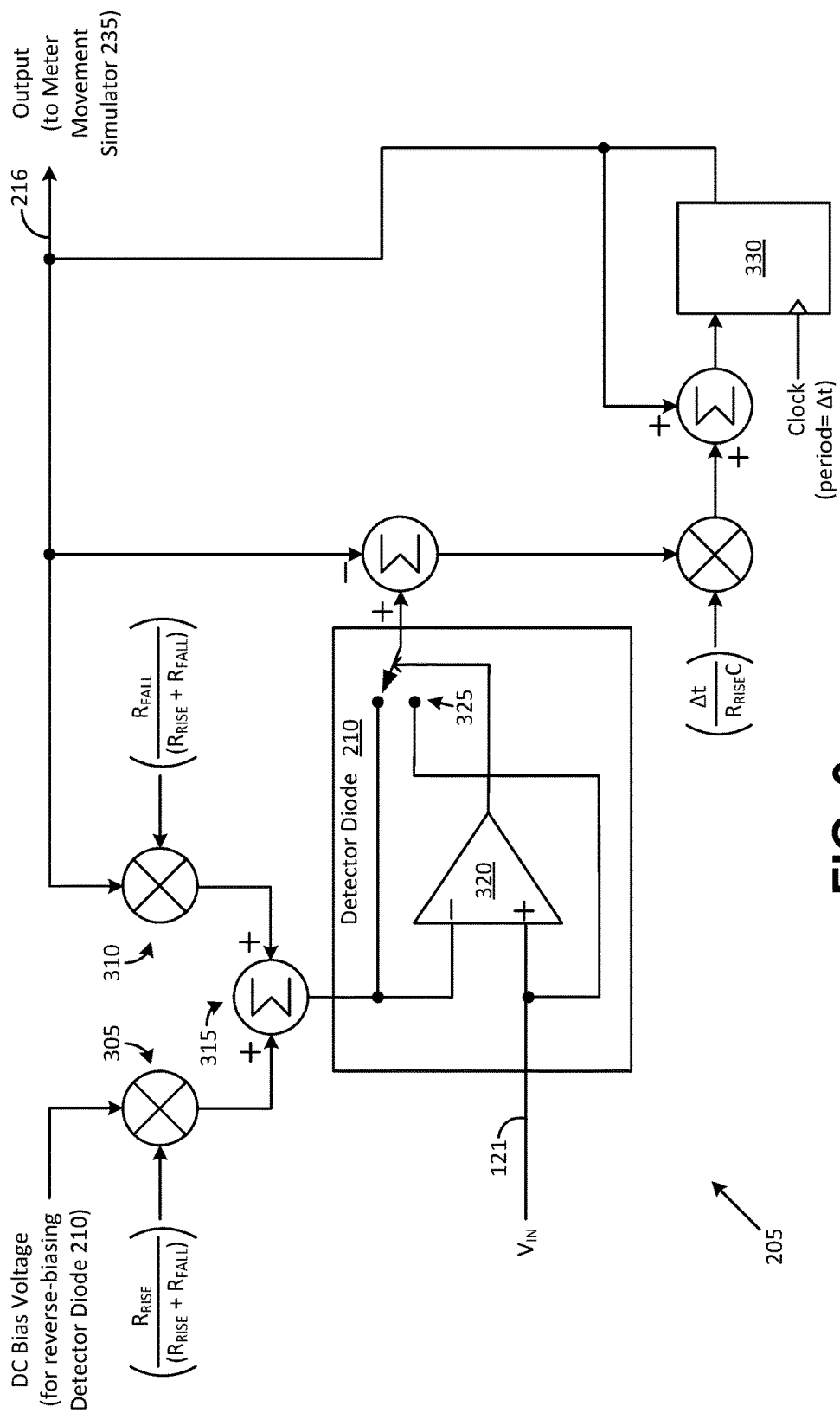
FIG. 3 illustrates an exemplary fast-attack/slow-decay circuit in accordance with another exemplary embodiment of the present invention.

FIG. 3 illustrates an alternative exemplary implementation of the fast-attack/slow-decay circuit 205 in accordance with the present invention. More particularly, the fast-attack/slow-decay circuit 205 may be implemented using one or more of various kinds of signal processing devices such as a digital signal processor (DSP), a field-programmable gate array (FPGA), and/or a programmable logic device (PLD). It should be understood that some of the functional blocks can be implemented in the form of executable code (firmware, for example) while some others can be implemented using logic circuitry. For example, each of the multiplier 305, the multiplier 310, and the summing circuit 315 can be implemented using logic circuitry (logic gates, operational amplifiers etc.) and/or by using firmware code.

As shown in this exemplary implementation, the multiplier 305 is configured to receive the DC bias voltage for reverse-biasing the detector diode 210. More particularly, the multiplier 305 represents a fast-attack portion of the fast-attack/slow-decay circuit 205. The multiplier 310 represents a slow-decay portion of the fast-attack/slow-decay circuit 205. The combination of the comparator 320 and the switch 325 represents the detector diode 210, while the register 330 and associated circuitry represent the time constant characteristics of the quasi-peak detection circuit 125. The parameter $R_{RISE}$ shown in the equations pertains to the resistor 220, while the parameter $R_{FALL}$ pertains to the resistor 215.

The amplitude of the DC bias voltage used in the quasi-peak detection circuit 125 shown in FIG. 3 and/or provided by the DC voltage source 230 in FIG. 2, may be determined in various ways. In general, the amplitude of the DC bias voltage can be defined by using a predicted DC voltage at the output node of the quasi-peak detection circuit 125. The predicted DC voltage is attributable to a predicted noise level contribution of the signal analyzer 100, which can be determined in various ways.

In one exemplary implementation, the predicted noise level contribution is determined by removing the DC bias voltage applied to the detector diode 210 and measuring the resulting voltage at the output of the quasi-peak detection circuit 125. The measured voltage indicates the predicted DC voltage in response to a noise level contribution of the signal analyzer 100. Removal of the DC bias voltage applied to the detector diode 210 is carried out for example by disconnecting a lead of the resistor 215 from the DC voltage source 230 (for example, via a switch that is controlled by the system controller 140) and connecting the disconnected lead to a ground node, or by turning off the DC voltage source 230 without disconnecting the resistor 215. When turned off, the DC voltage source 230 is configured to automatically couple the resistor 215 to DC ground.

As described above with respect to FIG. 1, the input signal that is coupled into the input port 101 of the signal analyzer 100 is propagated through the resolution bandwidth filter 115. The system controller 140 detects the resolution bandwidth setting of the resolution bandwidth filter 115 (typically set by a user when executing a signal measurement procedure upon the signal analyzer 100), and uses the resolution bandwidth setting to define an equivalent noise bandwidth of the input signal coupled into the input port 101 during the signal measurement procedure. The equivalent noise bandwidth is transformed to an equivalent noise power by using mathematical formulas such as kTB, where "k" is the Boltzmann's constant, "T" is an absolute temperature of the load circuit 208, and "B" is the noise bandwidth. The equivalent noise power is used together with at least one operating characteristic of the quasi-peak detection circuit 125 to determine an amplitude of the DC bias voltage used to place the detector diode in the reverse-biased condition.

In a variant of this approach, the equivalent noise bandwidth is multiplied by a calibrated noise density to determine a predicted noise power that is then converted into a predicted noise voltage. The predicted noise voltage is used together with at least one operating characteristic of the quasi-peak detection circuit 125 to determine an amplitude of the DC bias voltage used to reverse-bias the detector diode 210. One of the operating characteristics of the quasi-peak detection circuit 125 that can be used is based on a response of the quasi-peak detection circuit 125 to a sigma parameter of a Rayleigh distribution. The Rayleigh distribution describes noise at the input of the quasi-peak detection circuit 125 (on link 121).

The amplitude of the DC bias voltage used to reverse-bias the detector diode 210 can also be determined in other ways such as by using empirical data or by using theoretical calculations. In some cases, the amplitude of the DC bias voltage can be determined by using a trial-and-error method.

Irrespective of the manner by which the DC bias voltage is determined, when using the exemplary implementation shown in FIG. 2, the predicted DC voltage is indicated in the form of a DC voltage amplitude (+0.5 volts or −0.7V, for example). On the other hand, when using the exemplary implementation shown in FIG. 3, the predicted DC voltage can be defined in the form of a mathematical formula. For example, the mathematical formula can be defined as a Taylor series function having non-zero values for one or both of a set of $x^0$ terms and a set of $x^1$ terms. In one example implementation, the amplitude of the DC bias voltage used for reverse-biasing the detector diode 210 includes applying an optimization factor in a range between 0.3 and 2 to the predicted noise level contribution of the signal analyzer 100. This can be carried out by using a Taylor series function that includes an $x^1$ term having a coefficient that is within a range of about 0.3 to 2.0. Values below 0.3 largely fail to desensitize the fast-attack/slow-decay circuit 205 to noise, while values above 2.0 undesirably desensitize the fast-attack/slow-decay circuit 205 to small amplitude continuous-wave (CW) signals significantly more than to noise.

As described above, the fast-attack/slow-decay circuit 205 (shown in FIG. 2) has a charging time constant that is significantly smaller than a discharging time constant. For example, the values of the resistor 215, the resistor 220 and the capacitor 225 included in the fast-attack/slow-decay circuit 205 can be selected to provide a charging time constant that is 500 times smaller than a discharging time constant. The charging time constant is applicable when the instantaneous voltage level of the input signal exceeds the instantaneous voltage across the capacitor 225, while the discharging time constant is applicable when the instantaneous voltage level of the input signal is lower than the instantaneous voltage across the capacitor 225. When the charging time constant is 500 times smaller than the discharging time constant, the capacitor 225 charges at a rate that is 500 times faster than the discharge rate.

In the case of a noise signal that is characterized by a Rayleigh distribution, the voltage across the capacitor 225 is about twice the average voltage level of a noise envelope of the noise signal. The positive tail of the Rayleigh distribution is emphasized by a factor of 500 due to the charging time constant, thereby catering to small amplitude noise signal levels that can charge the capacitor 225 significantly faster than the discharge rate of the capacitor 225. Reverse-biasing the detector diode 210 reduces the discharge rate of the capacitor 225 because the discharging occurs with respect to the DC bias voltage rather than with respect to ground as done conventionally. The voltage across the capacitor 225 increases in order to balance the reduced discharge rate by operating along a smaller portion of the tail of the Rayleigh distribution. The reverse-biasing results in only about a 10% increase in the detected voltage at the node 213 in response to operating along the smaller portion of the tail. The noise floor adjustment procedure executed by the noise floor adjustment system 130 removes the effect of the 10% increase, thus reducing the effect of the noise by a factor of 10.

In the case of a CW signal, the reverse-biasing of the detector diode 210 does not allow detection of the CW signal when an amplitude of the CW signal is below the DC bias voltage. However, the effect of the noise level contribution of the signal analyzer 100 to the voltage present at the node 213 is not addressed for this small signal amplitude. It is therefore preferable to keep the coefficient of the $x^1$ term as low as feasible without causing noise desensitization. Hence, the 0.3 value in the range 0.3 to 2.0.

The upper end of the 0.3 to 2.0 range is selected on the basis of values greater than 2.0 leading to an undesirable level of errors in the voltage at node 213 when the CW signal has an amplitude that is say, twice the DC bias voltage. Using such values provides no advantage over using an unbiased detector diode.

Figure 4:
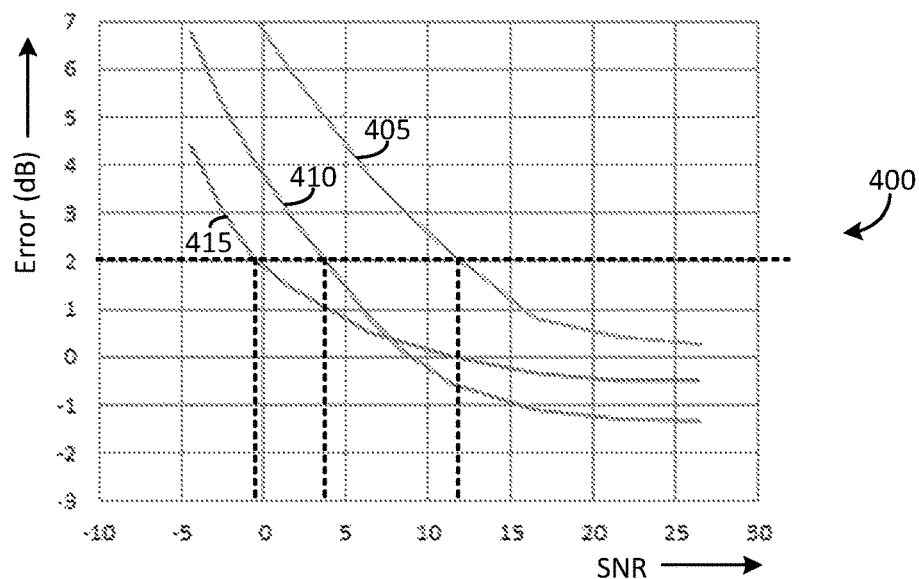
FIG. 4 shows an exemplary graph of bit errors versus SNR without reverse-biasing the detector diode.

FIG. 4 shows an exemplary graph of bit errors versus SNR without reverse-biasing the detector diode 210. The exemplary graph 400 includes a first plot 405 that is associated with an isolated signal, a second plot 410 associated with a 1 Hz signal, and a third plot 415 associated with a 2 Hz signal. The Comité International Special des Perturbations Radioélectriques (CISPR), which is also known as the International Special Committee on Radio Interference, sets standards for controlling electromagnetic interference in electrical and electronic devices. One of these standards places a ±2 dB tolerance limit on errors attributable to signal-to-noise performance and implementation imperfections of an equipment. The first plot 405 that is associated with the isolated pulse signal exceeds the +2 dB tolerance limit at around a signal-to-noise ratio of about 12, the second plot 410 associated with the 1 Hz pulse repetition frequency (PRF) signal exceeds the +2 dB tolerance limit at around a signal-to-noise ratio of about 4, and the third plot 415 associated with the 2 Hz PRF signal exceeds the +2 dB tolerance limit at around a signal-to-noise ratio of about −1 dB.

Figure 5:
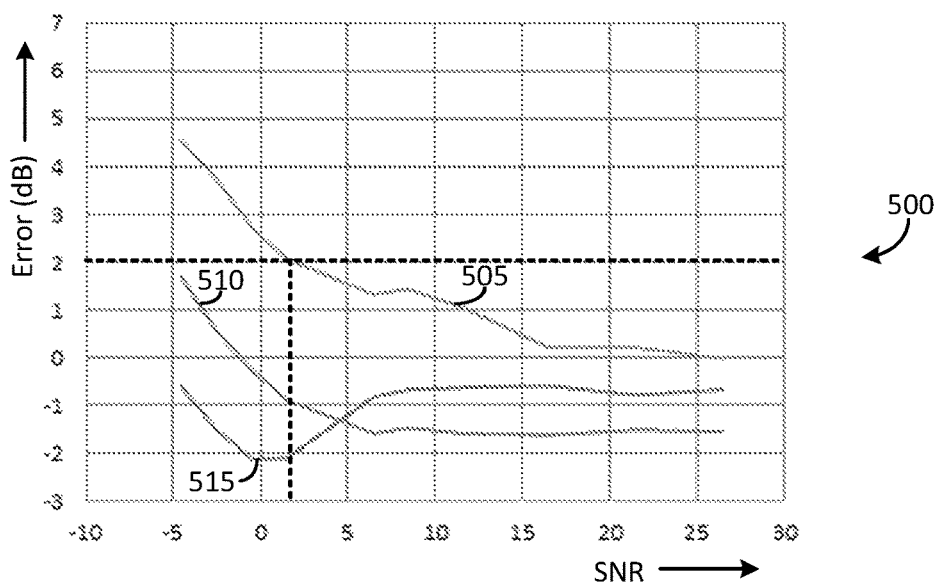
FIG. 5 shows an exemplary graph of bit errors versus SNR when noise compensation is applied in a conventional arrangement.

FIG. 5 shows an exemplary graph of errors versus SNR when noise compensation is applied in a conventional arrangement. In this conventional arrangement, a detector diode is typically connected to a ground node, via for example, a resistor connected to a cathode terminal of the detector diode (instead of being placed in a reverse-biased condition as described herein in accordance with various exemplary embodiments of the invention). The exemplary graph 500 includes a first plot 505 that is associated with an isolated pulse signal, a second plot 510 associated with a 1 Hz PRF signal, and a third plot 515 associated with a 2 Hz PRF signal. In comparison to the graph 400, it can be observed from graph 500 that there is an improvement in the performance of all three signals in terms of an increase in dynamic range.

However, the first plot 505 associated with the isolated pulse signal exceeds the 2 dB tolerance threshold at a signal-to-noise ratio of about 2 dB. The third plot 515 associated with the 2 Hz PRF signal exceeds the −2 dB tolerance threshold in a range that extends from a signal-to-noise ratio of about 2 dB to a signal-to-noise ratio of about −1 dB as a result of overcompensation being used when executing a noise subtraction procedure during noise compensation.

Overcompensation is generally undesirable for practical as well as psychological reasons. Psychologically, users expect that noise always leads to an increase in measured value rather than a decrease as exhibited by the third plot 515. Furthermore, the results of overcompensation can lead to results that erroneously indicate that an equipment has a satisfactory level of performance.

It is therefore desirable to address the conventional results indicated by the third plot 515, and it is also preferable to improve results indicated by the first plot 505 and the second plot 510.

Figure 6:
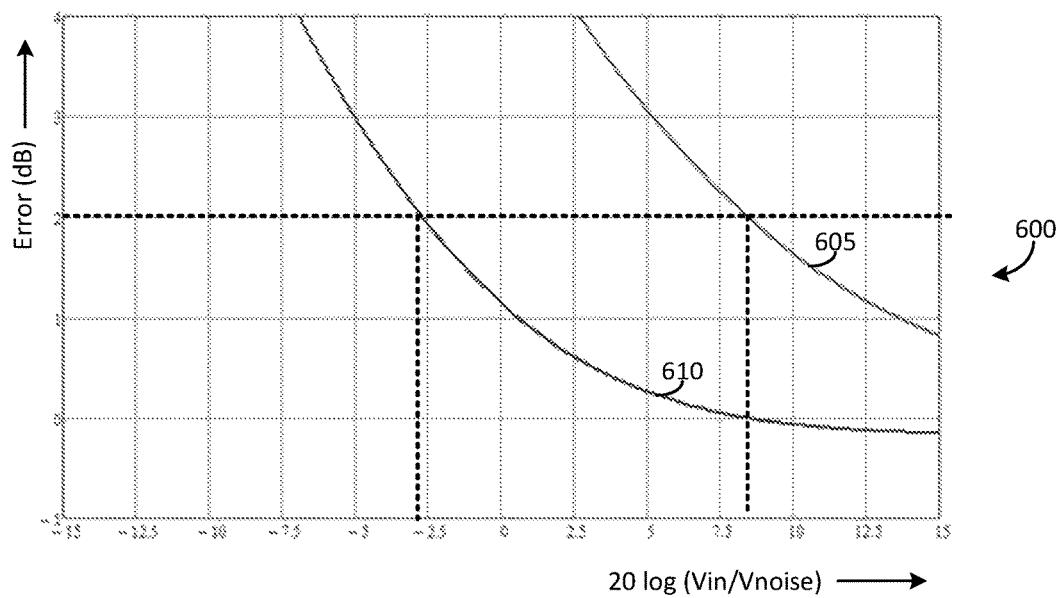
FIG. 6 shows an exemplary graph that provides a comparison between a response without noise floor adjustment and a response with noise floor adjustment in accordance with one or more embodiments of the invention.

Accordingly, the various exemplary embodiments described herein are directed at providing various improvements over conventional practice. FIG. 6 shows an exemplary graph 600 of a comparison between a response without noise floor adjustment and a response with noise floor adjustment in accordance with one or more embodiments of the invention with a CW (continuous wave) input signal. The plot 605 represents the response without noise floor adjustment and the plot 610 represents the response with noise floor adjustment in accordance with one or more embodiments of the invention. An improvement of more than 11 dB can be observed at the +2 dB error threshold. This improvement can be achieved by using non-linear subtraction when executing the noise adjustment procedure in accordance with various embodiments of the invention. The non-linear subtraction procedure can include application of a multiplying factor to an amplitude of the DC bias voltage used for placing the detector diode 210 in the reverse-biased condition, before using the result of the multiplication to carry out a noise adjustment.

Figure 7:
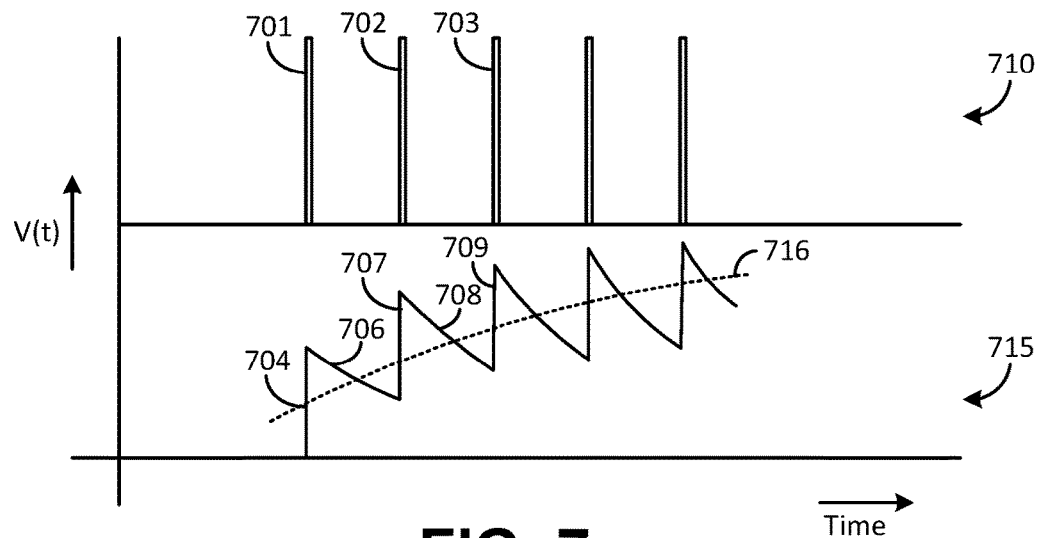
FIG. 7 shows an exemplary display of an output signal of the quasi-peak detection circuit in response to a large amplitude input signal without reverse-biasing the detector diode.

FIG. 7 shows an exemplary output signal 715 of the quasi-peak detection circuit 125 in response to a large amplitude input signal 710 without the DC bias voltage applied to the detector diode 210. The large amplitude input signal 710 in this example, is a sequence of narrow pulses having a 2 Hz pulse repetition frequency (PRF). A rising edge 704 of the output signal 715 is in response to a rising edge 701 of the large amplitude input signal 710. The fast rise-time of the rising edge 704 is due to the relatively small time constant offered by the RC combination of the resistor 220 and the capacitor 225 in the fast-attack/slow-decay circuit 205. In contrast, a slow fall-time of a falling edge 706 of the output signal 715 is due to the relatively large time constant offered by the RC combination of the capacitor 225 and a series combination of the resistor 220 and the resistor 215 in the fast-attack/slow-decay circuit 205.

In this example, an amplitude of the falling edge 706 does not fall all the way to ground potential before the next rising edge 702 of the large amplitude input signal 710 generates another rising edge 707 in the output signal 715. Similarly, an amplitude of a next falling edge 708 of the output signal 715 does not fall all the way to ground potential before the next rising edge 703 of the large amplitude input signal 710 generates another rising edge 709 in the output signal 715, and so on for each subsequent pulse. The cumulative effect of this action is a non-linear increase in the average DC voltage amplitude of the output signal 715 as indicated by the dashed line 716. The average DC voltage amplitude remains well above a noise floor level of the signal analyzer 100.

Figure 8:
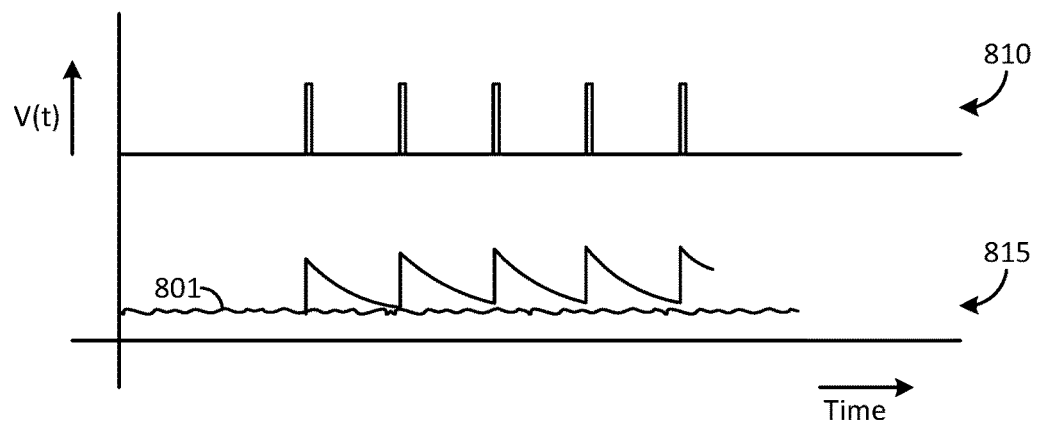
FIG. 8 shows an exemplary display of an output signal of the quasi-peak detection circuit in response to a medium amplitude input signal without reverse-biasing the detector diode.

FIG. 8 shows an exemplary display of an output signal 815 of the quasi-peak detection circuit 125 in response to a medium amplitude input signal 810 without the DC bias voltage applied to the detector diode 210. In this case, the medium amplitude of the input signal 810 leads to the output signal 815 having an average DC voltage amplitude that is barely above the noise floor level 801 of the signal analyzer 100.

Figure 9:
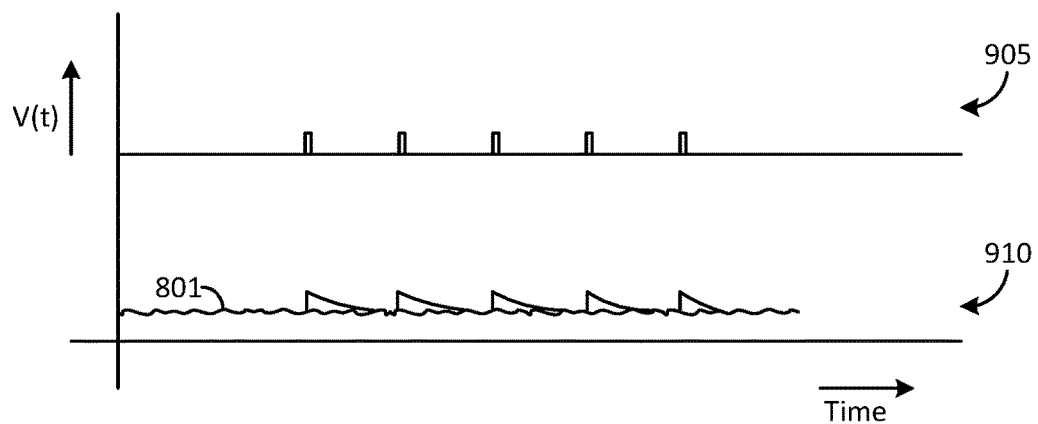
FIG. 9 shows an exemplary display of an output signal of the quasi-peak detection circuit in response to a small amplitude input signal without reverse-biasing the detector diode.

FIG. 9 shows an exemplary display of an output signal 910 of the quasi-peak detection circuit 125 in response to a small amplitude input signal 905 without the DC bias voltage applied to the detector diode 210. In this case, the small amplitude input signal 905 leads to the output signal 910 having an average DC voltage amplitude that is located below the noise floor level 801 of the signal analyzer 100.

Figure 10:
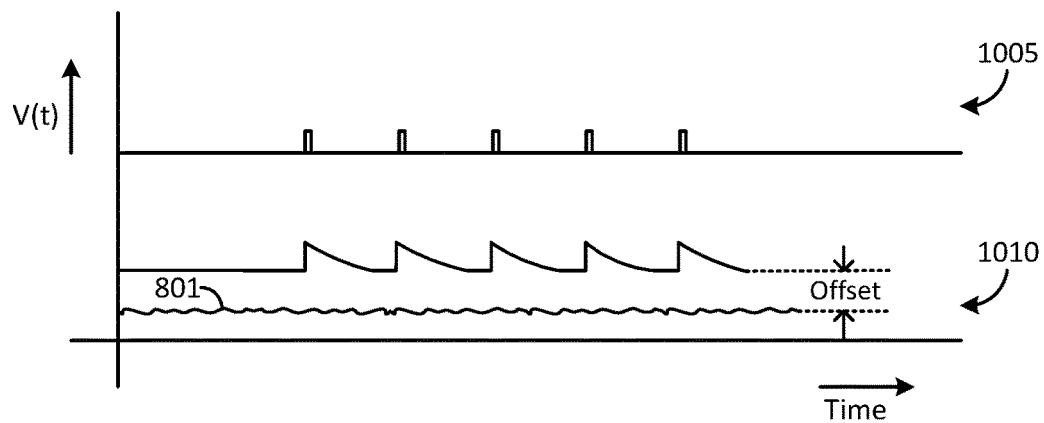
FIG. 10 shows an exemplary display of an output signal of the quasi-peak detection circuit in response to a small amplitude input signal when the detector diode is reverse-biased.

FIG. 10 shows an exemplary display of an output signal 1010 of the quasi-peak detection circuit 125 in response to a small amplitude input signal 1005 when the detector diode 210 is placed in a reverse-biased condition using the DC bias voltage in accordance with an exemplary embodiment of the invention. In this example, the small amplitude input signal 1005 has an amplitude that is the same as that of the small amplitude input signal 905 shown in FIG. 9. However, the application of the DC bias voltage to place the detector diode 210 in a reverse-biased condition generates an offset between the output signal 1010 and the noise floor level 801 of the signal analyzer 100. The noise floor adjustment system 130 compensates for the reverse-biased condition of the detector diode 210 by non-linearly subtracting the offset. Consequently, the output signal 1010 can be observed on the display 135 without any misleading or ambiguous indication of the noise-to-signal ratio.

Figure 11:
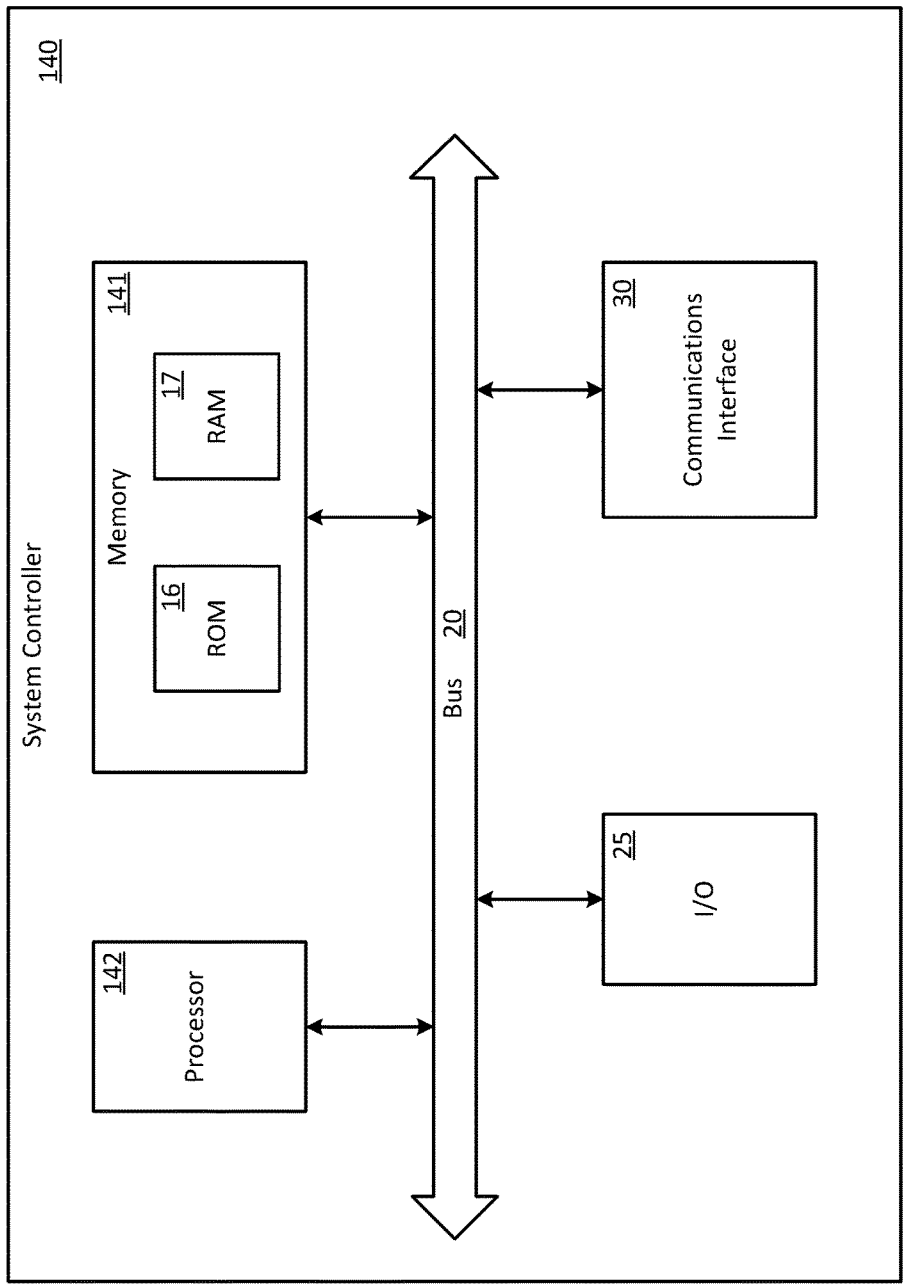
FIG. 11 shows a few exemplary components of a system controller that is a part of a signal analyzer in accordance with one or more embodiments of the invention.

FIG. 11 shows a few exemplary components of the system controller 140 in accordance with one or more embodiments of the invention. The exemplary components include the processor 142 that is configured to access the memory 141 via a bus 20 for fetching and executing computer-executable instructions stored in the memory 141. More particularly, the processor 142 is configured to fetch the computer-executable instructions for executing various method steps in accordance with various embodiments of the invention. The processor 142 may be implemented as appropriate in hardware, software, firmware, or combinations thereof. Software or firmware implementations of the processor 142 may include computer-executable or machine-executable instructions written in any suitable programming language to perform the various functions described. The memory 141, which may also be used in one or more implementations, to store data generated during the execution of the computer-executable instructions, can include a random access memory (RAM) 17 and a read-only memory (ROM) 16.

The system controller 140 also includes a communications interface 30 that allows the system controller 140 to communicate with various elements of the signal analyzer 100 (such as the resolution bandwidth filter 115, the envelope detector 120, the quasi-peak detection circuit 125, the noise floor adjustment system 130, and the display 135) and with devices or equipment capable of communicating with the signal analyzer 100 via the system controller 140. The communications with these other devices can be established via various data communication channels or ports, such as USB or COM ports. The system controller 140 further includes one or more input devices and/or output devices (indicated as I/O 25) such as a keyboard, a mouse, or a touch screen.

In summary, it should be noted that the invention has been described with reference to a few illustrative embodiments for the purpose of demonstrating the principles and concepts of the invention. It will be understood by persons of skill in the art, in view of the description provided herein, that the invention is not limited to these illustrative embodiments. Persons of skill in the art will understand that many such variations can be made to the illustrative embodiments without deviating from the scope of the invention.

What is claimed is:

1. A method comprising:
    reverse-biasing a detector diode of a quasi-peak detection circuit in a signal analyzer; and
    executing a noise floor adjustment procedure upon a signal propagated through the quasi-peak detection circuit, the noise floor adjustment procedure directed at least in part at compensating for a direct-current (DC) bias voltage used for reverse-biasing the detector diode.

2. The method of claim 1, wherein the DC bias voltage is defined at least in part by a predicted DC voltage at an output node of the quasi-peak detection circuit.

3. The method of claim 2, wherein the DC bias voltage is defined as a Taylor series function of the predicted DC voltage.

4. The method of claim 3, wherein the Taylor series function comprises one or both of a set of $x^0$ terms and a set of $x^1$ terms having non-zero values.

5. The method of claim 3, wherein the Taylor series function comprises an $x^1$ term having a coefficient that is within a range of about 0.3 to 2.0.

6. The method of claim 1, wherein the DC bias voltage is defined at least in part by a resolution bandwidth setting of a resolution bandwidth filter in the signal analyzer and at least one operating characteristic of the quasi-peak detection circuit.

7. The method of claim 6, wherein the at least one operating characteristic of the quasi-peak detection circuit comprises a response of the quasi-peak detection circuit to a sigma parameter of a Rayleigh distribution, the Rayleigh distribution describing noise at an input of the quasi-peak detection circuit.

8. The method of claim 1, wherein an amplitude of the DC bias voltage is defined at least in part by a predicted noise level contribution of the signal analyzer.

9. The method of claim 8, wherein defining the amplitude of the DC bias voltage comprises applying an optimization factor in a range between 0.3 and 2.0 to the predicted noise level contribution of the signal analyzer.

10. A method comprising:
providing a quasi-peak detection circuit in a signal analyzer, the quasi-peak detection circuit comprising a detector diode;
determining a predicted DC voltage at an output node of the quasi-peak detection circuit due to a noise level contribution of the signal analyzer when the detector diode is unbiased;
using the predicted DC voltage to define a DC bias voltage; and
using the DC bias voltage to reverse-bias the detector diode.

11. The method of claim 10, further comprising:
propagating a signal through the quasi-peak detection circuit after using the DC bias voltage to reverse-bias the detector diode; and
executing a noise floor adjustment procedure upon the signal propagated through the quasi-peak detection circuit, the noise floor adjustment procedure directed at least in part at compensating for the DC bias voltage used to reverse-bias the detector diode.

12. The method of claim 11, wherein the DC bias voltage is defined as a Taylor series function of the predicted DC voltage.

13. The method of claim 12, wherein the Taylor series function comprises one or both of a set of $x^0$ terms and a set of $x^1$ terms having non-zero values.

14. The method of claim 11, wherein the DC bias voltage is defined at least in part by a resolution bandwidth setting of a resolution bandwidth filter in the signal analyzer and at least one operating characteristic of the quasi-peak detection circuit.

15. The method of claim 14, wherein the at least one operating characteristic of the quasi-peak detection circuit comprises a response of the quasi-peak detection circuit to a sigma parameter of a Rayleigh distribution that describes noise at an input of the quasi-peak detection circuit.

16. The method of claim 14, wherein the resolution bandwidth setting is set by a user when executing a signal measurement procedure upon the signal analyzer.

17. A signal analyzer comprising:
a quasi-peak detection circuit comprising a detector diode; and
a voltage source that provides a direct-current (DC) bias voltage to reverse-bias the detector diode,
wherein a noise floor of a signal that is received in the signal analyzer and propagated through the quasi-peak detection circuit is adjusted following the quasi-peak detection circuit to at least in part compensate for the DC bias voltage used to reverse-bias the detector diode.

18. The signal analyzer of claim 17, wherein the signal is at least one of a radio-frequency signal or an electromagnetic interference (EMI) signal.

19. The signal analyzer of claim 17, further comprising:
a resolution bandwidth filter;
a memory that is used, at least in part, to store a set of computer-executable instructions; and
a processor configured to access the memory and execute the set of computer-executable instructions to at least:
detect a resolution bandwidth setting of the resolution bandwidth filter when a signal measurement procedure is executed upon the signal analyzer; and
use at least the resolution bandwidth setting and at least one operating characteristic of the quasi-peak detection circuit to determine an amplitude of the DC bias voltage used to reverse-bias the detector diode.

20. The signal analyzer of claim 19, further comprising:
an envelope detector for providing to the detector diode, an envelope of the signal received in the signal analyzer.

* * * * *